(12) United States Patent
Obara

(10) Patent No.: US 6,304,749 B1
(45) Date of Patent: Oct. 16, 2001

(54) RADIO EQUIPMENT AND TRANSMIT POWER CONTROLLING METHOD FOR THE SAME

(75) Inventor: Toshio Obara, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/288,322

(22) Filed: Apr. 8, 1999

(30) Foreign Application Priority Data

Apr. 17, 1998 (JP) .................................................. 10-107991

(51) Int. Cl.⁷ ...................................................... H04B 1/04
(52) U.S. Cl. ........................ 455/126; 455/127; 455/234.1; 330/129; 330/279
(58) Field of Search ................................... 455/234.1, 69, 455/70, 126, 127, 522; 330/279, 127, 129

(56) References Cited

U.S. PATENT DOCUMENTS

| | | | |
|---|---|---|---|
| 5,214,393 | * 5/1993 | Aihara | 330/279 |
| 5,376,895 | * 12/1994 | Aihara | 330/129 |
| 5,566,363 | * 10/1996 | Senda | 455/126 |
| 5,732,334 | * 3/1998 | Miyake | 455/126 |

OTHER PUBLICATIONS

WO 95/09489.

* cited by examiner

Primary Examiner—Tracy LeGree
Assistant Examiner—Erika A. Gary
(74) Attorney, Agent, or Firm—Pearne & Gordon LLP

(57) ABSTRACT

In the radio equipment in which necessary absolute precision of the transmit power can be assured while keeping the power variable amount precision in transmit power adjustment and the transmit power control of wide dynamic range and high linearity also is requested. The transmit power controlling method in the radio equipment, and the recording medium, when the transmit power is adjusted by detecting the error based on difference between the detected value which is obtained by detecting the transmit signal of the radio equipment and the detected value of the transmit signal when it is transmitted by the designated transmit power to be transmitted, then calculating the correction value by multiplying this error by the predetermined gain, then generating the control amount based on the correction value, and then re-setting the gain in transmit power amplification based on the control amount at a predetermined timing, the predetermined gain can be set such that an amount of change in the transmit power to be adjusted based on the control amount can be suppressed in the allowable range requested for an amount of change in the transmit power to be adjusted based on the reference value of the transmit power control, which is generated based on the designated transmit power.

21 Claims, 15 Drawing Sheets

RADIO EQUIPMENT AND TRANSMIT POWER CONTROLLING METHOD FOR THE SAME

BACKGROUND OF THE INVENTION

The present invention relates to a radio equipment such as a mobile telephone employed in a mobile communication, a transmit power controlling method in the radio equipment, and a recording medium for recording a program to execute the transmit power controlling method.

In the mobile communication device such as the mobile telephone employed commonly, a function for controlling its own transmit power according to a distance between a base station and a mobile station in transmitting information is installed. In order to improve a frequency utilization efficiency by reducing interference between communication channels, transmit power control for keeping constant a power of the signal which can reach the base station is essential in a multiple access type communication system for multiplying a plurality of communication channels.

In particular, in the mobile communication device of CDMA (Code Division Multiple Access) system by using the spread spectrum technology, there is a high possibility that the so-called far-and-near problem is caused, and the interference with others must be suppressed to the lowest minimum. Therefore, transmit power control to enable a wide dynamic range (e.g., 70 to 80 dB) and high linearity is requested. In the wideband CDMA (W-CDMA) system which is examined now as a next generation mobile communication system, precision request of transmit power becomes higher in high power transmission and also transmit power control with higher precision is requested.

The transmit power control is classified into two types, i.e., "open loop control" in which an intensity of signal supplied from the base station is measured by the mobile station and then transmit power of the mobile station is adjusted based on measured results, and "closed loop control" in which the intensity of signal supplied from the mobile station is measured by the base station, then transmit power controlling data are transmitted from the base station to the mobile station based on measured results, and then a transmit power of the mobile station is adjusted according to the data. In the current mobile communication device, it is common that "power precision compensation control" is not executed wherein transmit power can be suppressed within a predetermined range relative to a target value in the mobile station in itself when the above transmit power control is effected, but merely "limiting control" is executed wherein transmit power can be suppressed not to exceed an allowable upper limit value of transmit power is effected.

However, according to the above radio equipment in the prior art, in the communication circumstances in which transmit power control of wide dynamic range and high linearity is needed, it has been difficult to assuring absolute precision of the transmit power (allowable error of the variable range in the transmit power control) while keeping power variable amount precision (allowable error of the power control target value) when the transmit power being output from the mobile station is controlled variably, so that sometimes it has been difficult to satisfy transmit power precision being specified by the radio law or regulation at the maximum power transmission. In addition, there is a possibility that, if the mobile station comes closest to the base station, the interference with others is increased. Further, it is possible to cause various disadvantages in practical use since the connection is easily disconnected if the mobile station goes farthest from the base station.

SUMMARY OF THE INVENTION

The present invention has been made in view of the above circumstances in the conventional art, and it is an object of the present invention to provide a radio equipment, a transmit power controlling method in the radio equipment, and a recording medium such advantages can be achieved that the transmit power precision compensating function for converging the transmit power into the predetermined range of the power control target value can be achieved in the radio equipment in which necessary absolute precision of the transmit power can be assured while keeping the power variable amount precision in transmit power adjustment and the transmit power control of wide dynamic range and high linearity also is requested.

According to the present invention, a radio equipment comprises transmit power designating means for designating a transmit power of a transmit signal transmitted from the radio equipment; control reference value generating means for generating a reference value of transmit power control based on the transmit power being designated; timing controlling means for specifying a control timing of the transmit power; error detecting means for detecting an error based on difference between a detected value of the transmit signal from the radio equipment and a detected value of the transmit signal when it is transmitted by the transmit power being designated; gain multiplying means for multiplying a detected error by a predetermined gain to calculate a correction value; control amount generating means for generating a control amount based on the correction value; and power adjusting means for adjusting the transmit power by re-setting a gain in transmit power amplification at the control timing, based on a reference value of the transmit power control and the control amount; wherein the predetermined gain is set such that an amount of change in the transmit power which is adjusted based on the control amount can be suppressed in an allowable range which is requested for an amount of change in the transmit power being adjusted based on the reference value.

Furthermore, according to the present invention, the control amount generating means generates a control amount by adding the correction value, which is effected according to the control timing, every control unit, and the predetermined gain is set such that an amount of change in the transmit power which is adjusted based on the control amount per one control unit can be made smaller than an allowable range requested for an amount of change in the transmit power which is adjusted based on the reference value.

Furthermore, the control amount generating means generates a control amount by subtracting, every control unit, a predetermined value which is set such that an amount of change in the transmit power per one control unit can be made smaller than an allowable range requested for an amount of change in the transmit power which is adjusted based on the reference value when the transmit power of the transmit signal is less than a predetermined power.

Still further, according to the present invention, a radio equipment comprises a gain variable setting means for setting the predetermined gain variably based on an error detected by the error detecting means such that the correction value is fixed constant.

Still further, according to the present invention, a gain setting means for setting the predetermined gain every transmission mode in answer to a level of an allowable range requested for an amount of change in the transmit power being adjusted based on the reference value; a transmission mode deciding means for deciding the transmission mode;

and a selecting means for selecting a predetermined gain which corresponds to a decided transmission mode from the gain setting means.

Moreover, according to the present invention, a transmit power controlling method in a radio equipment, comprising the steps of: transmit power designating step of designating a transmit power of a transmit signal transmitted from the radio equipment; control reference value generating step of generating a reference value of transmit power control based on the transmit power being designated; error detecting step of detecting an error based on difference between a detected value of the transmit signal from the radio equipment and a detected value of the transmit signal when it is transmitted by the transmit power being designated; gain multiplying step of multiplying a detected error by a predetermined gain to calculate a correction value; control amount generating step of generating a control amount based on the correction value; and power adjusting step of adjusting the transmit power by re-setting a gain in transmit power amplification at a predetermined control timing, based on a reference value of the transmit power control and the control amount; wherein the predetermined gain is set such that an amount of change in the transmit power which is adjusted based on the control amount can be suppressed in an allowable range which is requested for an amount of change in the transmit power being adjusted based on the reference value.

Moreover, according to the present invention, a computer-readable recording medium for recording a program which causes a computer to execute a transmit power controlling method in a radio equipment.

As described above, according to the radio equipment, the transmit power controlling method in the radio equipment, and the recording medium, when the transmit power is adjusted by detecting the error based on difference between the detected value which is obtained by detecting the transmit signal of the radio equipment and the detected value of the transmit signal when it is transmitted by the designated transmit power to be transmitted, then calculating the correction value by multiplying this error by the predetermined gain, then generating the control amount based on the correction value, and then re-setting the gain in transmit power amplification based on the control amount at a predetermined timing, the predetermined gain can be set such that an amount of change in the transmit power to be adjusted based on the control amount can be suppressed in the allowable range requested for an amount of change in the transmit power to be adjusted based on the reference value of the transmit power control, which is generated based on the designated transmit power. Therefore, such advantages can be achieved that the transmit power precision compensating function for converging the transmit power into the predetermined range of the power control target value can be achieved in the radio equipment in which necessary absolute precision of the transmit power can be assured while keeping the power variable amount precision in transmit power adjustment and the transmit power control of wide dynamic range and high linearity also is requested.

In one control unit executed according to the predetermined control timing, the predetermined gain is set such that the amount of change in the transmit power based on the control amount can be reduced smaller than the requested allowable range of the amount of change in the transmit power based on the reference value, then the control amount is generated by adding the correction value per control unit, and then the transmit power is adjusted by using the control amount. Therefore, the transmit power can be adjusted so as to approach the designated transmit power to be transmitted gradually within the allowable range of the requested amount of change, and predetermined absolute precision of the transmit power can be assured.

Further, when the transmit power of the transmit signal is reduced less than predetermined power, the control amount can be generated by subtracting the predetermined value, which makes the amount of change in the transmit power per control unit smaller than the requested allowable range of the amount of change in the transmit power being adjusted based on the reference value, every control unit. Therefore, in the out-of-range of the detected value of the transmit signal, the control amount can be restored gradually into the initial state while adjusting the transmit power in the allowable range of the requested amount of change. Then, when the transmit power is in the detection range of the detected value of the transmit signal again, the radio equipment can be shifted smoothly to the transmit power adjusting operation which is executed based on the correction value.

Furthermore, the predetermined gain is set variably based on the detected error and then the control amount is made constant based on the correction value after the error has been multiplied by the predetermined gain. Therefore, the transmit power can be adjusted within the allowable range of the requested amount of change based on a constant correction value irrespective of the current error, and thus the transmit power can be converged to the designated transmit power to be transmitted at a higher speed, so that the absolute precision of the transmit power can be improved.

Moreover, the predetermined gain can be set variably based on the designated transmit power being designated by the transmit power designating means such that linear distortion of the gain control executed by the previously set power adjusting means (power adjusting step) can be compensated. Therefore, the linearity of the output transmit power with respect to the designated transmit power can be maintained regardless of the intensity of the transmit power and thus the linearity of the transmit power control characteristic can be ensured with higher precision.

Also, the predetermined gain can be set in respective transmit modes which correspond to the levels of the requested allowable ranges to the amount of change in the transmit power being adjusted based on the reference value. Therefore, the transmit power control can be carried out more appropriately in response to a plurality of transmission modes in which allowable ranges of the amount of change in the requested transmit power are set differently respectively.

When the feedback control is carried out by multiplying the error between the power control target value equivalent to the transmit power to be transmitted and the actual transmit power detected value by the loop gain in the feedback loop to calculate the correction value and then feeding back the control amount based on the correction value to the power adjusting means for adjusting the transmit power, the correction value can be set smaller than the allowable range of the power adjusting amount being executed every control unit at the predetermined timing by setting the loop gain of the feedback loop to less than 1. Therefore, the transmit power can always be adjusted within the allowable range of the requested amount of change, and thus the predetermined absolute precision of the transmit power can be assured with keeping the linearity of the transmit power control characteristic.

DETAILED DESCRIPTION OF THE PREFERRED EMBODIMENTS

Embodiments of a radio equipment, a transmit power controlling method in the radio equipment, and a recording medium according to the present invention will be explained in detail with reference to the accompanying hereinafter. Though the radio equipment and the transmit power controlling method in the radio equipment according to the present invention will be explained in detail in the explanation of respective embodiments, it is evident that explanation of the recording medium according to the present invention is contained in the following explanation of the transmit power controlling method since such recording medium is employed to record a program for executing the transmit power controlling method.

FIRST EMBODIMENT

Figure 1:
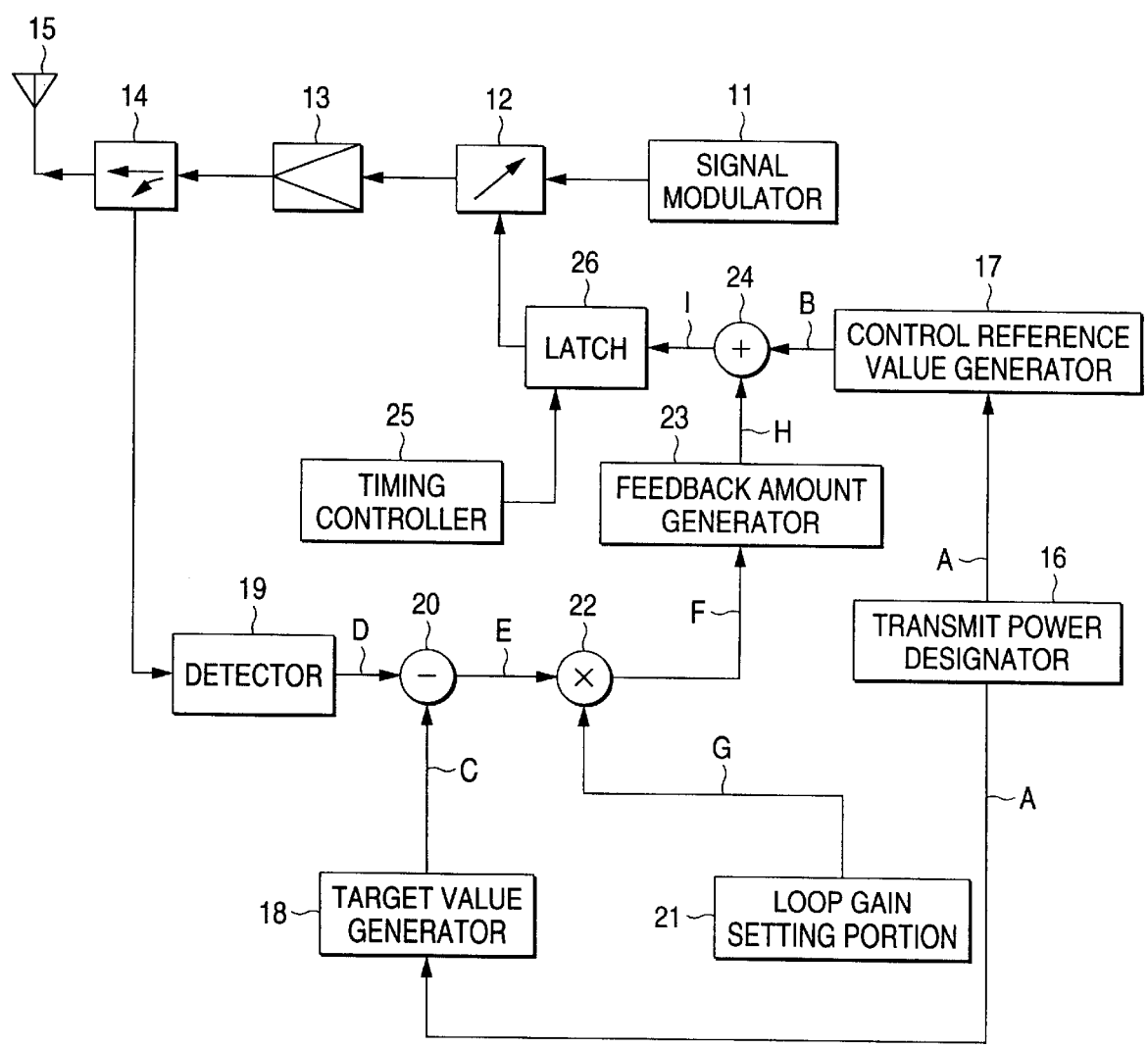
FIG. 1 is a view showing a configuration, mainly a transmit power controller, of a radio equipment according to a first embodiment of the present invention.

FIG. 1 is a view showing a configuration, mainly a transmit power controller, of a radio equipment according to a first embodiment of the present invention. The radio equipment of the first embodiment is provided in, for example, the mobile communication device serving as the base station or the mobile station of the cellular communication system, etc., and power-amplifies the signals containing transmit information and then transmits them to the destination of communication. In the first embodiment, transmit power control of the radio equipment in the mobile station will be explained while taking up the mobile station particularly. However, the present invention is not limited to this and maybe applied to the base station, for example.

In FIG. 1, the radio equipment of the first embodiment comprises, as a basic transmit system, a signal modulator 11 for modulating the transmit signal including transmission information, a variable gain circuit (AGC) 12 for controlling transmit power amplification gain of the transmit signal variably, a power amplifier 13 for power-amplifying the modulated transmit signal to output it, a directional coupler 14 for picking up a part of transmit power output which is subjected to power amplification, and a transmitting antenna 15 for transmitting the transmit signal being power-amplified.

Also, in FIG. 1, the radio equipment of the first embodiment comprises a control system constituting a feedback loop to execute transmit power control. The radio equipment of the first embodiment comprises, as the control system, a transmit power designator 16, a control reference value generator 17, a target value generator 18, a detector 19, an error detector 20, a loop gain setting portion 21, a loop gain multiplier 22, a feedback amount generator 23, a control variable adder 24, a timing controller 25, and a latch 26.

Then, the transmit power designator 16 corresponds to a transmit power designating means, and outputs transmit power designating information A serving as a transmit power control target based on transmit power control data transmitted from the base station, etc. The timing controller 25 corresponds to a timing controlling means, and generates a timing control signal in one feedback control to specify transmit power control timing (referred to as one control step hereinafter, and corresponding to one control unit). The control reference value generator 17 corresponds to a control reference value generating means, and receives the transmit power designating information A from the transmit power designator 16 and then generates a transmit power control reference value B. In other words, the transmit power control reference value B is a control signal reference value supplied to the variable gain circuit 12 in one feedback control.

Further, the target value generator 18, the detector 19, and the error detector 20 correspond to an error detecting means, and detects difference between a detected value D and an error detecting power control target value C by the error detector 20 to thus output a transmit power error E. The detected value D is obtained by detecting the output of the directional coupler 14 by the detector 19. The power control target value C is generated by the target value generator 18 based on the transmit power designating information A. This power control target value C is the detected value of the transmit signal which is transmitted by a designated transmit power as a control target. Detected values being measured previously every designated transmit power are stored in the target value generator 18 as a table, etc., and then the detected values are output by referring to the table based on the transmit power designating information A.

In addition, the loop gain setting portion 21 and the loop gain multiplier 22 corresponds to a gain multiplying means. The loop gain multiplier 22 multiplies a loop gain G of feedback loop, which is set by the loop gain setting portion 21, and the transmit power error E which is the output of the error detector 20 to thus calculate a feedback correction value F which corresponds to a correction value. Also, the feedback amount generator 23 corresponds to a control amount generating means, and generates a feedback amount H corresponding to a control amount based on the feedback correction value F.

In this case, the loop gain G is set in the loop gain setting portion 21 such that an amount of change in the transmit power, which is adjusted based on the feedback amount H, can be suppressed within an allowable range requested for an amount of change in the transmit power, which is adjusted based on the transmit power control reference value B. This setting method is a feature respect of the radio equipment of the first embodiment.

Then, the control variable adder 24, the latch 26, the variable gain circuit 12, and the power amplifier 13 correspond to power adjusting means. The control variable adder 24 adds the transmit power control reference value B and the feedback amount H, and then the latch 26 latches an added result. Then, the content of the latch 26 is supplied to the variable gain circuit 12 at a timing control signal being generated by the timing controller 25, and then the transmit power is adjusted by setting the gain in the transmit power amplification in the power amplifier 13 again.

Then, respective function blocks of the transmit power designator 16, the control reference value generator 17, the target value generator 18, and the loop gain setting portion 21 are composed of a microprocessor (MPU), etc. A series of operation control in the transmit power controller can be implemented by a software program which is executed by the MPU.

Figure 2:
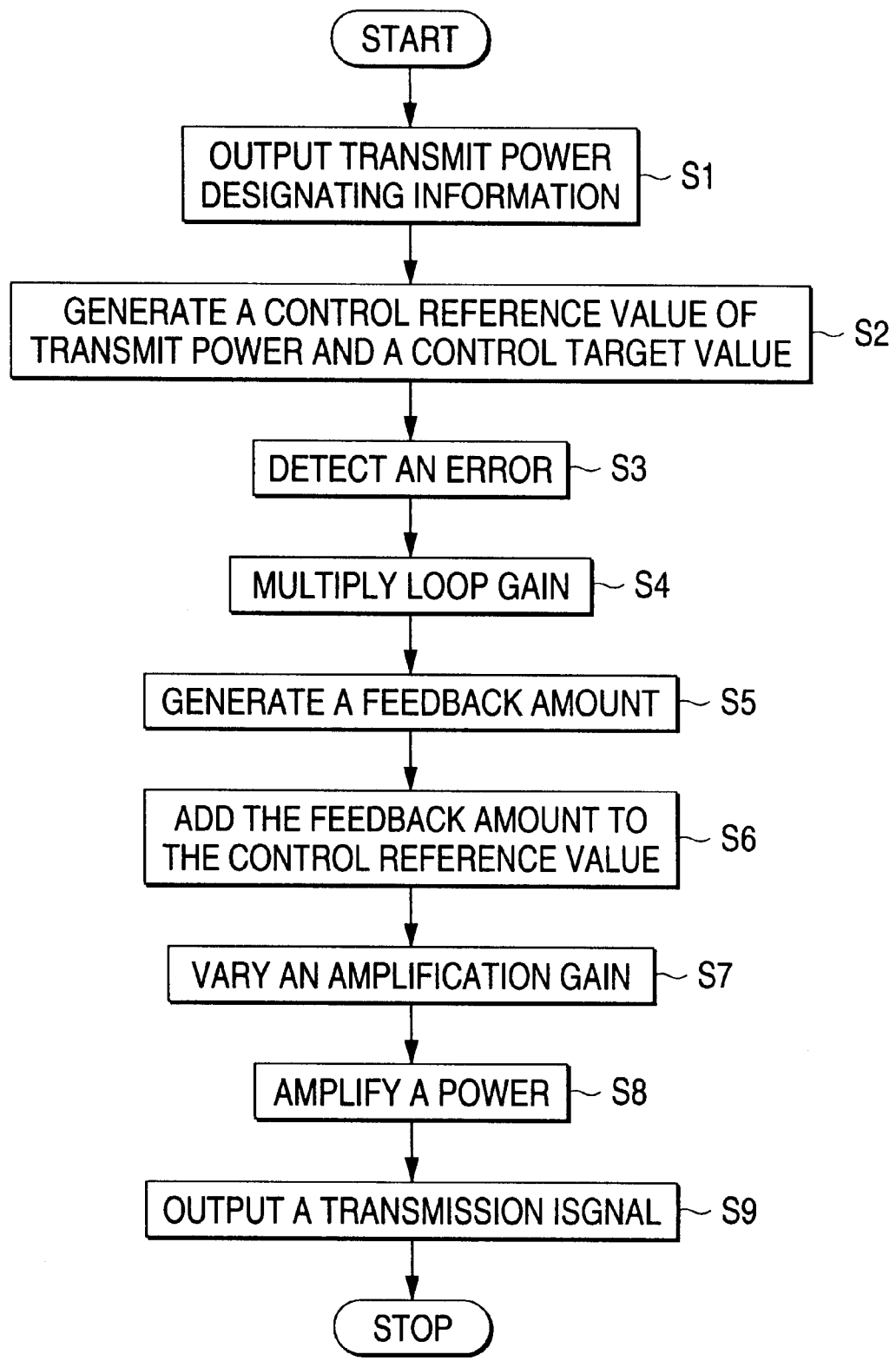
FIG. 2 is a flowchart showing a transmit power controlling method employed in the radio equipment according to the first embodiment of the present invention.
Figure 3:
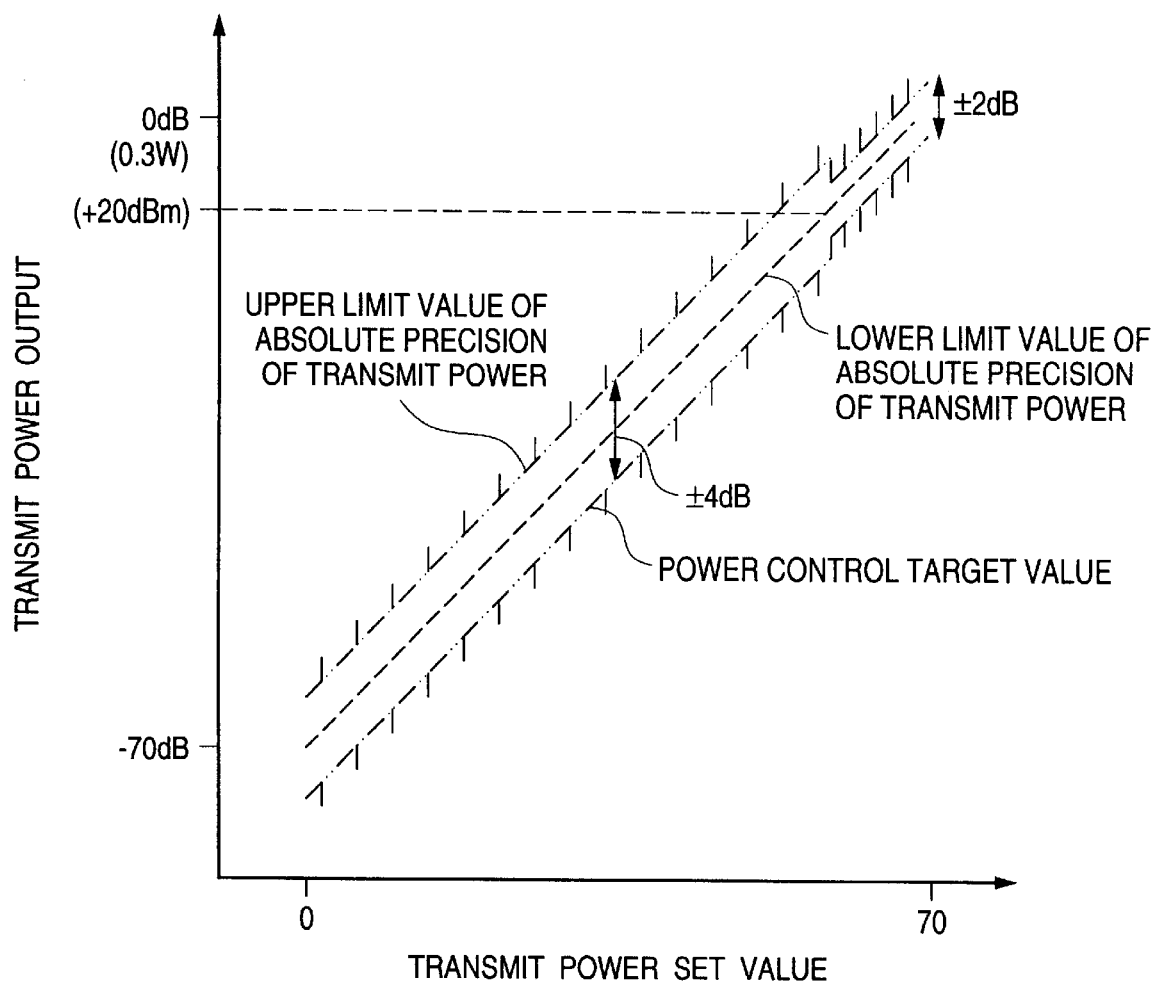
FIG. 3 is a view showing a relationship between transmit power designating information and transmit power in controlling the transmit power.
Figure 4:
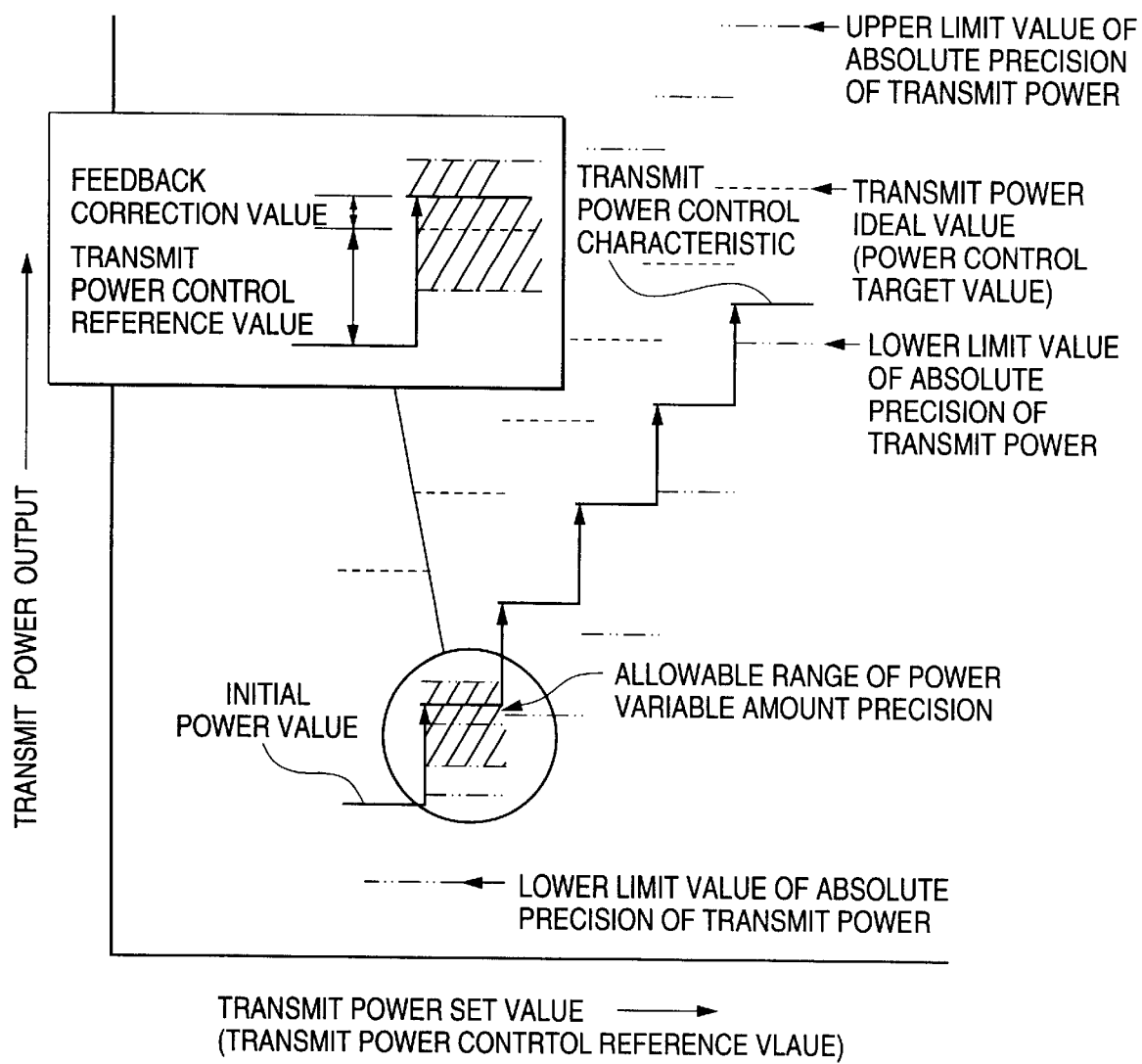
FIG. 4 is an enlarged view showing an operation of a part of the relationship in FIG. 3.
Figure 5:
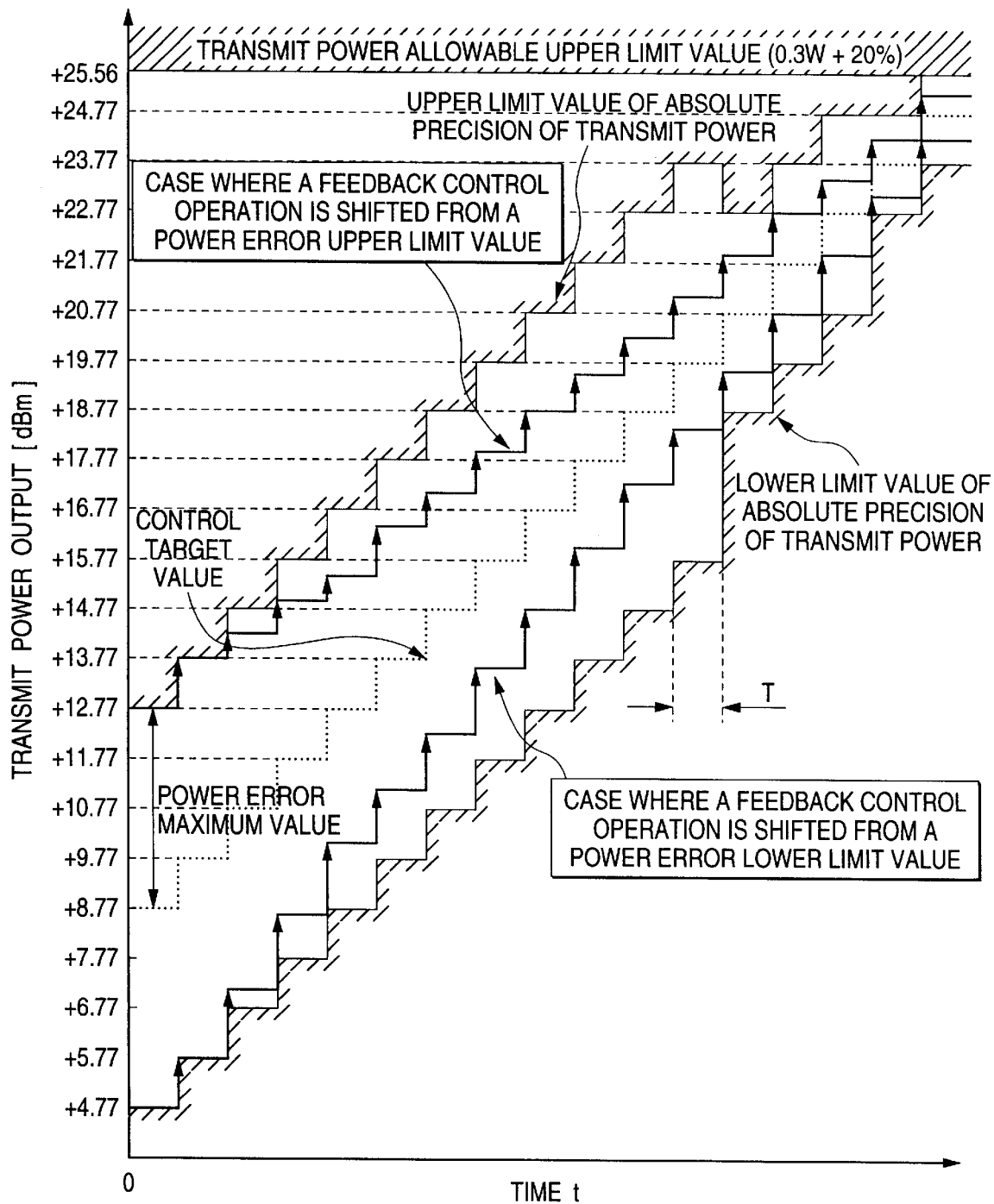
FIG. 5 is a view showing an operation executed when transmit power increasing control is executed successively.
Figure 6:
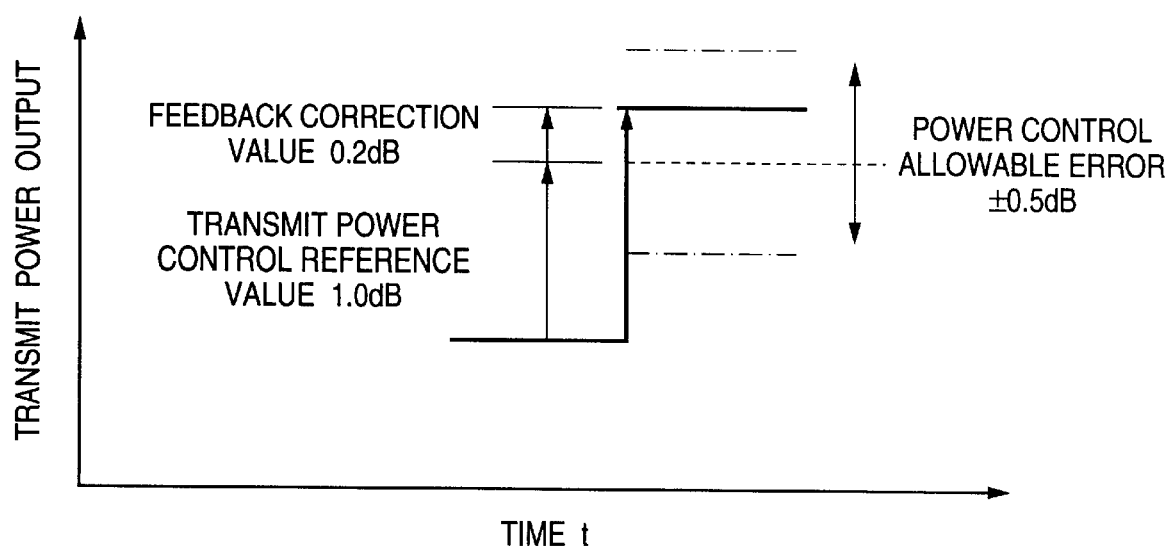
FIG. 6 is a view showing an example of a loop gain setting method.

Next, an operation of the transmit power controller constructed as above will be explained hereunder. FIG. 2 is a flowchart showing a transmit power controlling method employed in the radio equipment according to the first embodiment of the present invention. FIG. 3 is a view showing a relationship between a transmit power set value (corresponding to transmit power designating information) and transmit power output when the transmit power is controlled to be increased. FIG. 4 is an enlarged view showing an operation of a part of the relationship in FIG. 3. FIG. 5 is a view showing an operation when transmit power increasing control is executed successively. FIG. 6 is a view showing an example of a loop gain setting method.

For example, in the mobile communication device of CDMA system, the transmit power control which enables a wide dynamic range and high linearity is requested, and therefore linear power control must be carried out over a wide range in increasing/decreasing the transmit power. In particular, in the wideband CDMA (W-CDMA) system which is watched with interest as the next generation mobile communication system, predetermined absolute precision of the transmit power is requested over all bandwidths and also higher precision is requested in the high power transmission. In this case, "absolute precision of the transmit power" is allowable error of the power control target value C.

In the following explanation, there is explained the case where a maximum transmit power output is set to 0.3 W and transmit power control is effected in a range of 70 dB. At this time, an allowable upper limit value of the transmit power absolute value is 0.3 W+20%, i.e., +25.58 dBm, for example. The absolute precision of the transmit power (allowable error of the power control target value) is set to ±2 dB at the high power (more than +20 dBm), and is set to ±4 dB at the smaller power (less than +20 dBm) than the high power. Also, as linearity of transmit power control, power variable amount precision (allowable error of the variable range in the transmit power control) of ±0.5 dB can be assured by varying the transmit power by 1 dB per one control step.

In this disclosure, like the case where the mobile station goes away from the base station, an operation to increase the transmit power output uniformly will be explained hereunder. In the radio equipment in the mobile station, characteristics of all over transmit power amplification system are changed because of change in the ambient temperature, transmit frequency, change in the power supply voltage, secular change, etc., and therefore errors are caused in some times between the actual output power value and the designated power value. FIG. 5 shows the case where transmit power increasing control is executed successively by increasing the power by 1 dB everyone control step period T (e.g., T=0.625 ms) from the state that power error is caused up to both an upper limit value of absolute precision of the transmit power and a lower limit value of absolute precision of the transmit power after the transmission has been started at a time t=0.

In the transmit power control, first the transmit power designating information A, which is a power control target value to be transmitted to respective blocks to which control lines are connected from the transmit power designator 16, are output (step S1). When receives the transmit power designating information A, the control reference value generator 17 generates the transmit power control reference value B and also the target value generator 18 generates the power control target value C serving as a convergent target in power precision compensation (step S2). The transmit power control reference value B is a reference value of the control signal which is supplied to the variable gain circuit 12 to obtain the transmit power output (transmit power ideal value shown in FIG. 4) instructed by the transmit power designating information A, and is identical to the transmit power set value depicted in the abscissa in FIG. 4. The power control target value C is an output value of the detector 19 when the designated transmit power output can be derived.

In contrast, the transmit signal which is modulated by the signal modulator 11 is power-amplified by the power amplifier 13 according to the gain which is set by the variable gain circuit 12. At this time, gain control of the transmit power amplifying system is performed by the variable gain circuit 12. However, in the initial state, the feedback amount generator 23 is reset and also the transmit power control reference value B is supplied to the variable gain circuit 12 via the control variable adder 24 and the latch 26 as the power control value I as it is, whereby the gain in power amplification can be adjusted. Then, the modulated transmit signal is power-amplified by the power amplifier 13, then is transmitted to the transmitting antenna 15 as a transmit power output end via the directional coupler 14, and then is irradiated from the transmitting antenna 15 into a space.

Upon the signal transmission, the transmit power of the transmit signal is detected by the directional coupler 14 with a certain attenuation amount and then detected by the detector 19. Then, the detected value D as the output of the detector 19 and the power control target value C as the output of the target value generator 18 are compared and subtracted by the error detector 20, and thus the current transmit power error E of the power control target value C is detected (step S3).

Then, the loop gain G is set and stored by the loop gain setting portion 21 such that a power variable amount per one control step becomes an appropriate value (1±0.5 dB). Then, the current transmit power error E is multiplied by the loop gain G in the loop gain multiplier 22 (step S4)

Then, an example of a setting method of the loop gain G will be explained with reference to FIG. 6 hereunder. In the first embodiment, as described above, in order to execute the feedback control of the transmit power under the condition that power control allowable error of ±0.5 dB is satisfied against the power change of 1 dB, a feedback correction value F is set sufficiently smaller than the power variable amount per one control step by setting the loop gain G as G<<1 so as to come close gradually to the control target value every control step. Since (transmit power error E)×(loop gain G)=(feedback correction value F), the loop gain G can be given as G=Fmax/Emax=0.05 because of Emax×G=Fmax if a maximum value Fmax of the feedback correction value F is set to 0.2 dB smaller than 0.5 dB (Fmax<<0.5).

The feedback correction value F output from the loop gain multiplier 22 is added in the feedback amount generator 23 every one control step. Then, an added value is output to the control variable adder 24 as a feedback amount H (step S5). Then, the feedback amount and the control reference value are added by the control variable adder 24 (step S6). After such addition, the power control value I is input into the variable gain circuit 12 via the latch 26. At that time, a timing control signal is output from the timing controller 25 every previously set period corresponding to one control step, and then an output of the control variable adder 24 is held by the latch 26 for one control step period. The amplification gain is varied by the variable gain circuit 12 based on an input value from the latch 26 (step S7). After this, the transmit signal is power-amplified by the power amplifier 13 (step S8). Then, the transmit signal is output from the transmitting antenna 15 via the directional coupler 14 (step S9).

The transmit power error E can be reduced gradually to the control target value by repeating the above mentioned feedback control process (steps S1 to S9), and thus predetermined transmit power output can be derived in response to the transmit power designating information (see FIG. 5). In the first embodiment, the feedback control operation can be carried out by feeding back as the feedback amount H the value which is obtained by adding the minute feedback correction value F every control step, not to exceed the allowable range of power variable amount precision shown as a shaded area in FIG. 4. In other words, if the transmit power output is not varied at a time up to the control target value by one control step but it is varied gradually up to the control target value by a plurality of control steps, the high linearity of the transmit power control can be assured and desired absolute precision of transmit power can be achieved.

In general, in the communication system in which the power variable amount precision of the transmit power is highly requested, when the transmit power control is performed in the mobile station itself by using the above feedback loop, the power variable amount precision cannot be executed satisfactorily if the power variable amount per control step is set large. In contrast, in the first embodiment, if the loop gain is set by the loop gain setting portion 21 such that the feedback correction value per control step can be reduced sufficiently smaller than the allowable range of the power variable amount precision, the transmit power controlling method can be attained wherein the power variable amount per control step can be held at an appropriate value, the power variable amount precision can be satisfied, and the absolute precision of transmit power can be accomplished.

As described above, according to the first embodiment, by reducing the feedback correction value in one control step by virtue of setting of the loop gain such that the power variable amount per control step can be always suppressed within the allowable range of the power variable amount precision, the feedback control can be achieved to compensate the transmit power precision while satisfying the power variable amount precision and also the absolute precision of transmit power can be assured. Especially, in the first embodiment, the high absolute precision of transmit power can be maintained during the high power output.

SECOND EMBODIMENT

Figure 7:
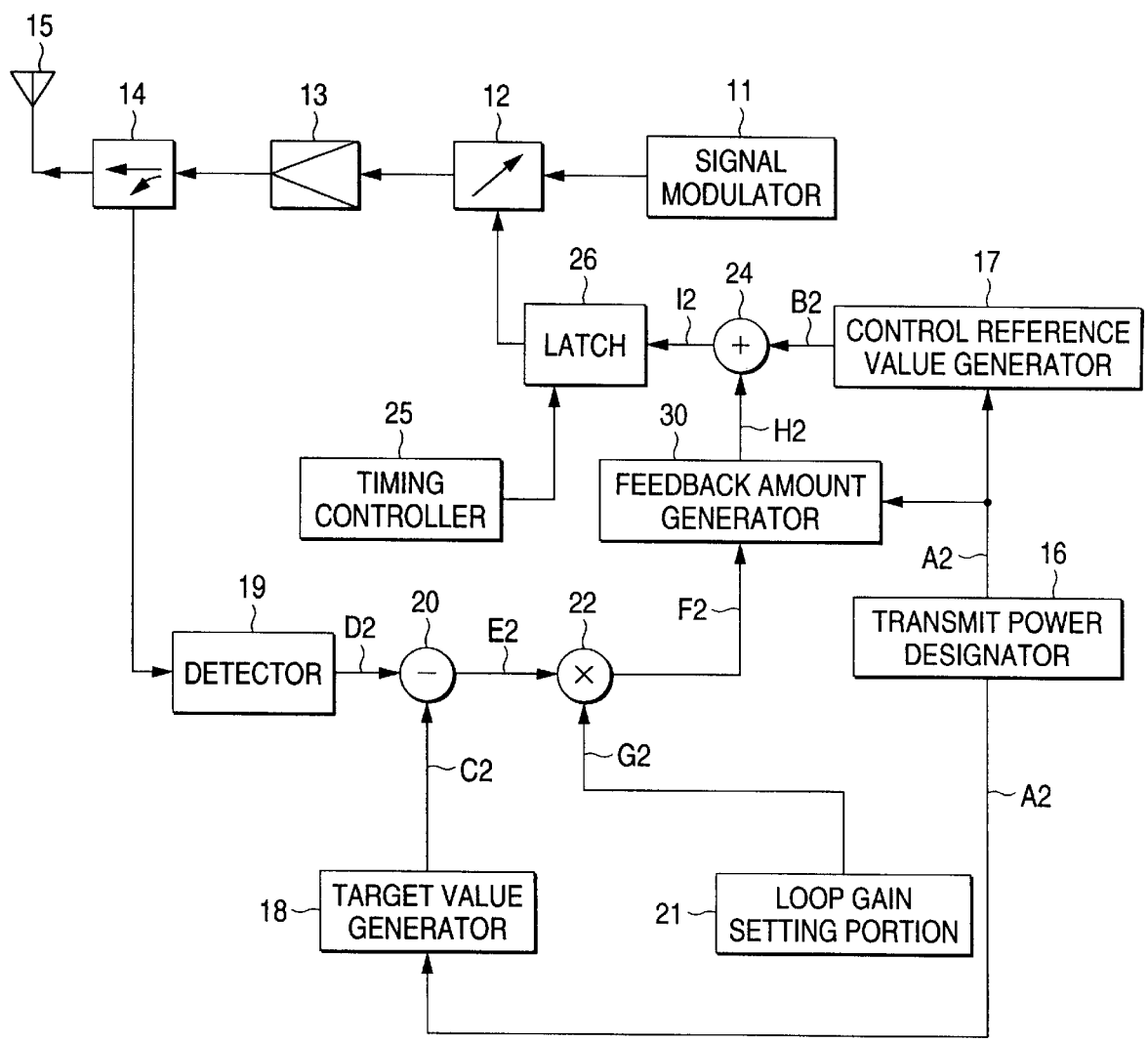
FIG. 7 is a view showing a configuration, mainly a transmit power controller, of a radio equipment according to a second embodiment of the present invention.
Figure 8:
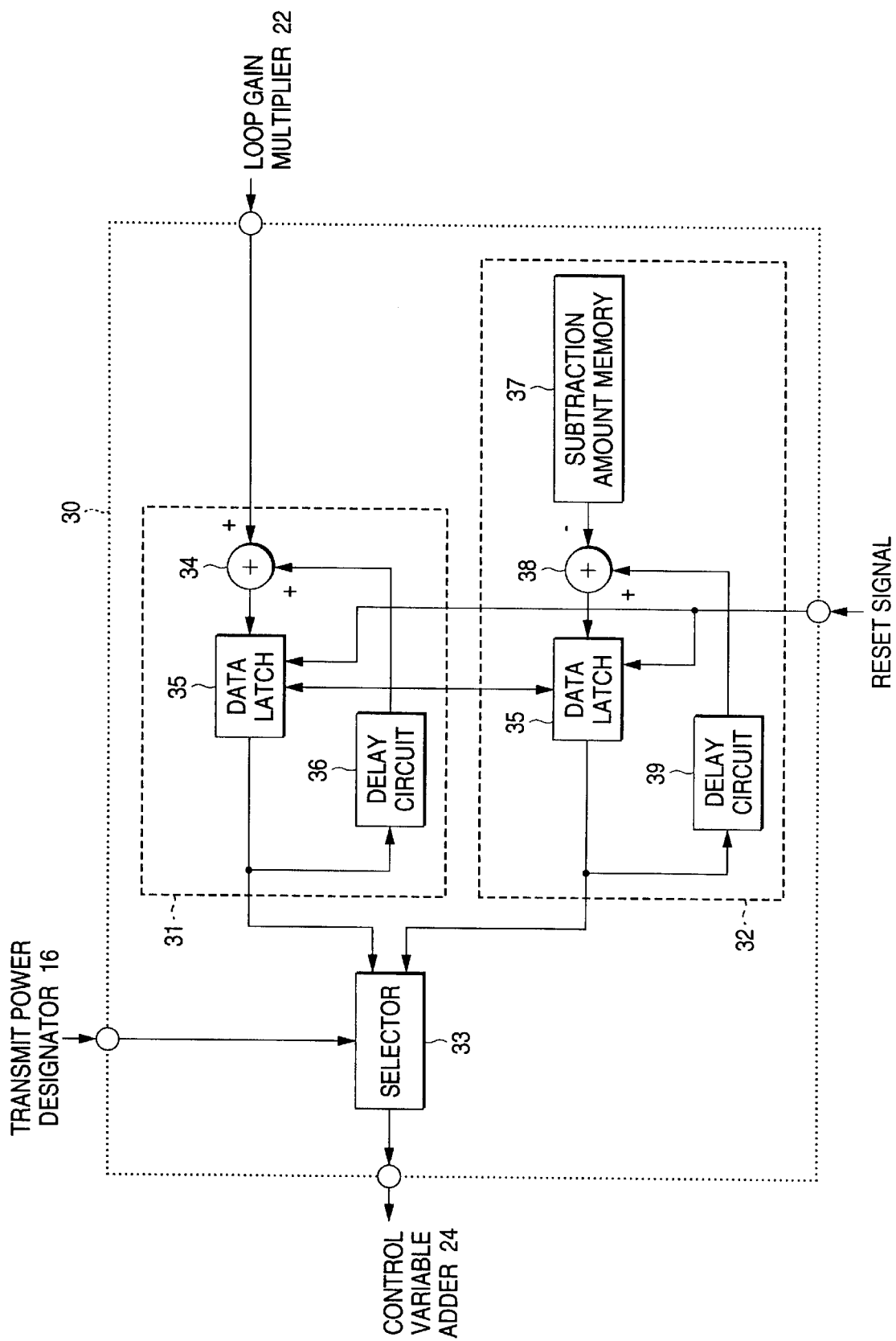
FIG. 8 is a view showing a configuration of a feedback amount generator in the second embodiment of the present invention.

FIG. 7 is a view showing a configuration, mainly a transmit power controller, of a radio equipment according to a second embodiment of the present invention. FIG. 8 is a view showing a configuration of a feedback amount generator in the second embodiment of the present invention.

In the second embodiment, an example in which a configuration of the feedback amount generator is varied is given. Configurations and operations of other parts are similar to those in the first embodiment. Therefore, only differences will be explained here in and same references are affixed to identical constituent elements and their explanation will be omitted.

The feedback amount generator 30 of the second embodiment is constructed to switch an operation for generating the feedback amount H2 in response to transmit power designating information A2 supplied from the transmit power designator 16. In the second embodiment, an operation of the feedback amount generator 30 is switched in response to the situation when the transmit power is less than predetermined power, i.e., when the input signal to the detector 19 is less than a predetermined value to thus fail to detect the power (out of the power detection range) or when the transmit power is more than the predetermined power (in a power detection range).

As shown in FIG. 8, the feedback amount generator 30 comprises an in-power detection range operating portion 31, an out-of-power detection range operating portion 32, and a selector 33 for selecting these outputs selectively.

The in-power detection range operating portion 31 comprises a feedback amount adder 34, a data latch 35, and a delay circuit 36. The feedback amount adder 34 add s a feedback correction value F2 supplied from a loop gain multiplier 22 and an output of the delay circuit 36. The data latch 35 holds an output of the feedback amount adder 34. Also, an output of the data latch 35 is delayed by the delay circuit 36 by one control step period and then input into the feedback amount adder 34. The feedback amount generator 23 of the first embodiment may be constructed similarly to the in-power detection range operating portion 31.

The out-of-power detection range operating portion 32 comprise a subtraction amount memory 37, a feedback amount subtracter 38, the data latch 35, and a delay circuit 39. The subtraction amount memory 37 stores a previously set predetermined value as a subtraction amount. The feedback amount subtracter 38 subtracts the subtraction amount stored in the subtraction amount memory 37 from an output of the delay circuit 39. The data latch 35 holds an output of the feedback amount subtracter 38. The delay circuit 39 delays an output of the data latch 35 by one control step period to then input its delayed output into the feedback amount subtracter 38.

The subtraction amount stored in the subtraction amount memory 37 is set to a value smaller than the power control allowable error 0.5 dB per the above control step, e.g., 0.2 dB which is substantially equal to the feedback correction value obtained after the loop gain multiplication such that an amount in change of the transmit power being adjusted based on the feedback amount H2 can be set smaller than an allowable range requested for an amount in change of the transmit power being adjusted based on a transmit power control reference value B2. In this case, the data latch 35 in the in-power detection range operating portion 31 and the out-of-power detection range operating portion 32 may be constructed to have a data latching means made of a register, etc. commonly.

The selector 33 includes threshold power information employed to discriminate the in-power detection range and the out-of-power detection range, selects the output of the in-power detection range operating portion 31 or the out-of-power detection range operating portion 32 selectively in accordance with the transmit power designating information A2 supplied from the transmit power designater 16, and outputs the selected output to a control variable adder 24.

In FIG. 7, if the input signal to the detector 19 is enoughly large and is present in the signal detectable range, a detected signal effective for a detected value D2 output from the detector 19 can be obtained. Therefore, like the first embodiment, with the use of the feedback control which generates a feedback amount H2 based on a transmit power error E2 to then feed back it to the variable gain circuit 12, the transmit power can be adjusted to get a predetermined transmit power. However, if the transmit power control is executed to respond to the wide dynamic range, it is anticipated that the input signal to the detector 19 is small to fall below the signal detectable range. In this case, because a transmit power adjusting effect produced by the feedback control is eliminated, the feedback amount H2 must be reset to an initial state. This is because the radio equipment is enabled to be shifted smoothly to the transmit power adjusting operation executed by the feedback control when the input signal falls again within the power detecting range, so that disadvantages are not caused even if operating conditions such as the ambient temperature are changed.

Figure 9:
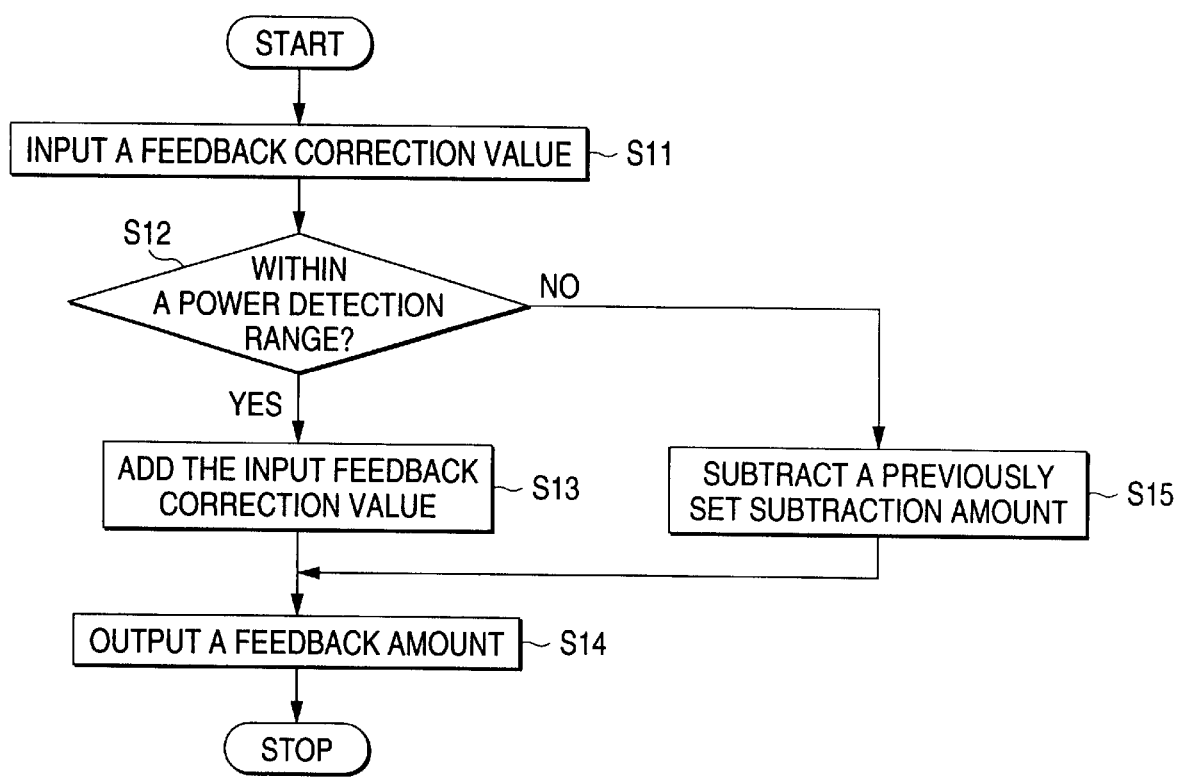
FIG. 9 is a flowchart showing an operation of the feedback amount generator.
Figure 10:
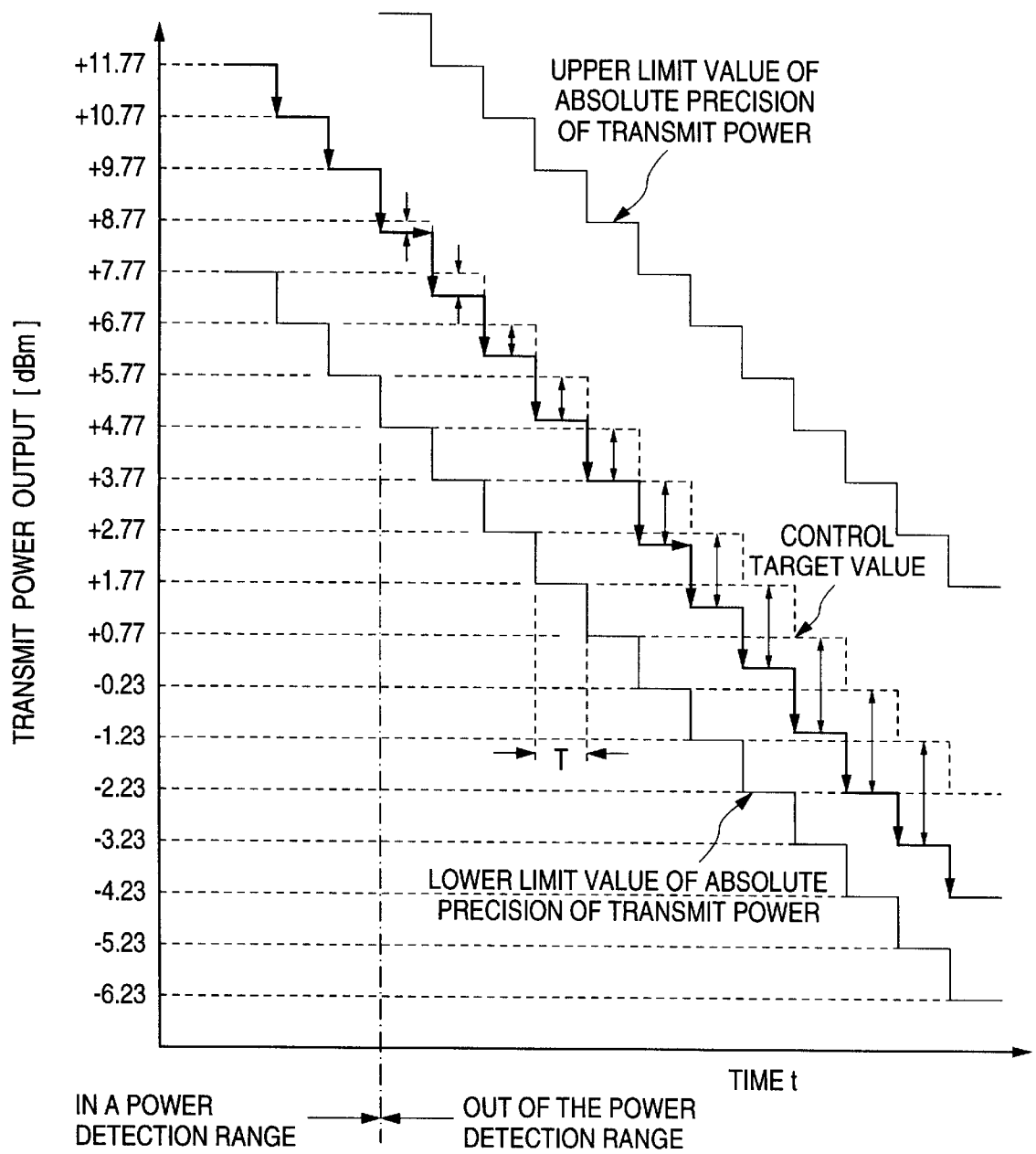
FIG. 10 is a view showing an operation executed when transmit power decreasing control is executed successively.

Next, an operation of the transmit power controller according to the second embodiment will be explained hereunder. FIG. 9 is a flowchart showing an operation of the feedback amount generator. FIG. 10 is a view showing an operation executed when transmit power decreasing control is executed successively. An operation executed in the case where the transmit power output is decreased uniformly to be shifted from the in-power detection range to the out-of-power detection range, like the case where the mobile station is moving on toward the base station, will be discussed hereunder.

In the feedback amount generator 30, the feedback correction value F2 is input from the loop gain multiplier 22 to the in-power detection range operating portion 31 (step S11). The transmit power designating information A2 is input from the transmit power designator 16 to the selector 33. It is decided based on the output power value to be transmitted whether or not the transmit power is within the power detection range (step S12). If the transmit power is within the power detection range, the input feedback correction value F2 being input in the in-power detection range operating portion 31 is added, and then a resultant value is held by the data latch 35 (step S13). The selector 33 selects the output of the in-power detection range operating portion 31 and then outputs it as a feedback amount H2 (step S14). In the initial state, the data latch 35 is reset by a reset signal.

On the contrary, if it has been decided in step S12 that the transmit power is out of power detection range, the subtraction amount being stored in the subtraction amount memory 37 is subtracted from the value being held by the data latch 35 in the out-of-power detection range operating portion 32

(step S15). Then, the selector 33 selects the output of the out-of-power detection range operating portion 32 and then outputs it as the feedback amount H2 (step S14).

In the out-of-power detection range, the feedback amount H2 being held in the data latch 35 is gradually subtracted by repeating the above mentioned feedback amount generating processes (steps S11 to S15) to thus approach the initial state (see FIG. 10). At this time, the transmit power control is performed such that the power variable amount per control step can be suppressed within an allowable range of power variable amount precision.

Like the above, according to the second embodiment, in the out-of-power detection range, the power variable amount per control step can always be suppressed within an allowable range of power variable amount precision and thus the high linearity can be ensured in the transmit power control.

THIRD EMBODIMENT

In third to fifth embodiments described later, an example wherein a configuration of the loop gain setting portion is varied is given hereunder.

Figure 11:
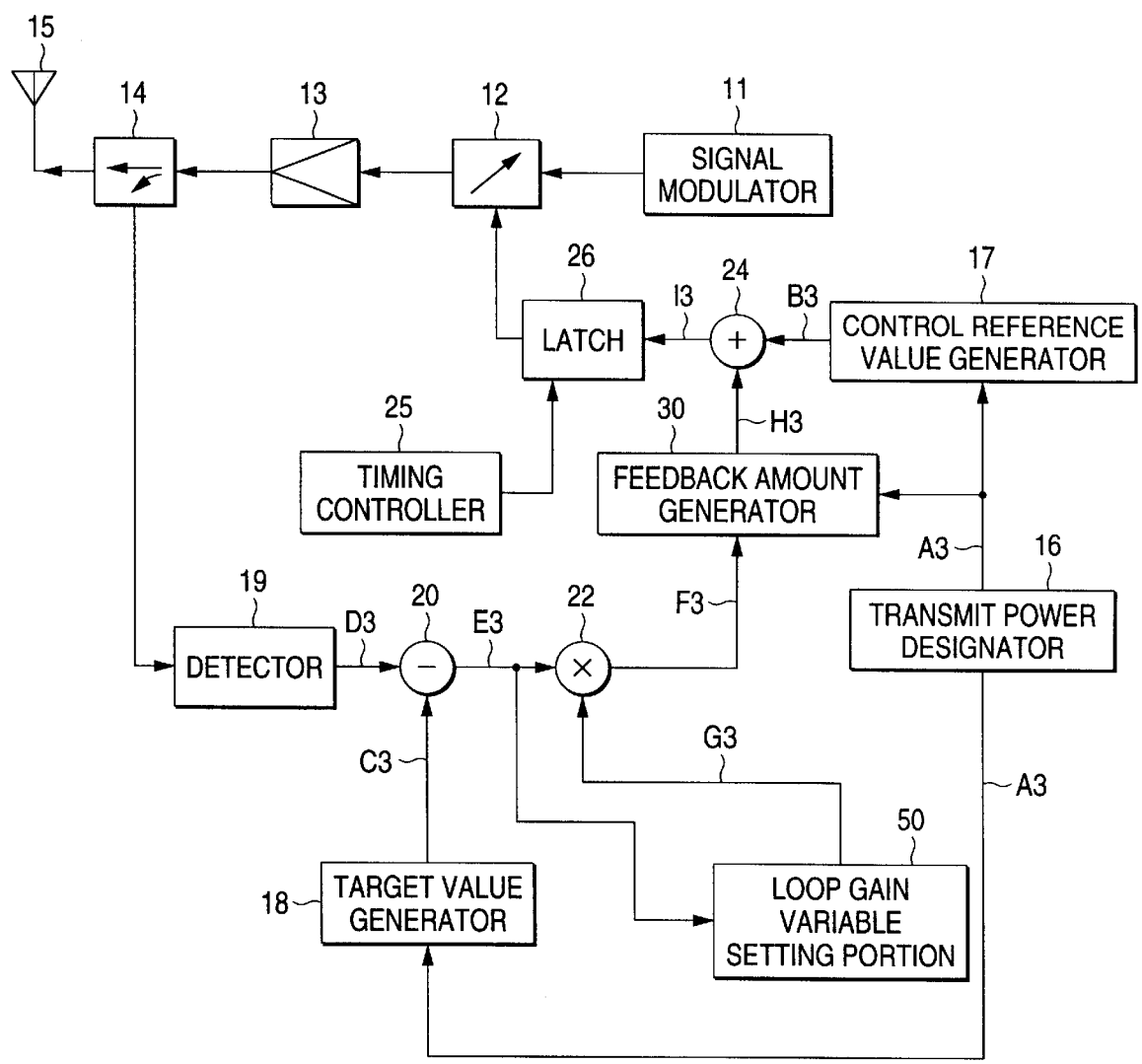
FIG. 11 is a view showing a configuration, mainly a transmit power controller, of a radio equipment according to a third embodiment of the present invention.

FIG. 11 is a view showing a configuration, mainly a transmit power controller, of a radio equipment according to a third embodiment of the present invention. In the third embodiment, a loop gain variable setting portion 50 which varies the loop gain in response to the output of the error detector 20 is provided. Configurations and operations of other parts are similar to those in the first embodiment. Therefore, only differences will be explained herein and same references are affixed to identical constituent elements and their explanation will be omitted.

The loop gain variable setting portion 50 serves to vary the loop gain G3 in answer to the intensity of a transmit power error E3 output from the error detector 20, output such loop gain G3, and keep constant a feedback correction value F3 as a result multiplied by the loop gain multiplier 22. For example, the loop gain G3 is enhanced as the transmit power error E3 is reduced by the transmit power control. In this manner, regardless of the intensity of the error between the transmit power and the designated transmit power, the transmit power can be adjusted within the allowable range of power variable amount based on a constant feedback correction value by keeping the feedback correction value F3 constant. Therefore, the transmit power can be converged toward a designated transmit power to be transmitted at a higher speed, so that absolute precision of transmit power can be improved.

Likewise, according to the third embodiment, feedback control to compensate the transmit power precision, which can not only satisfy the power variable amount precision but also converge the transmit power toward the designated transmit power to be transmitted at a higher speed, can be achieved.

FOURTH EMBODIMENT

Figure 12:
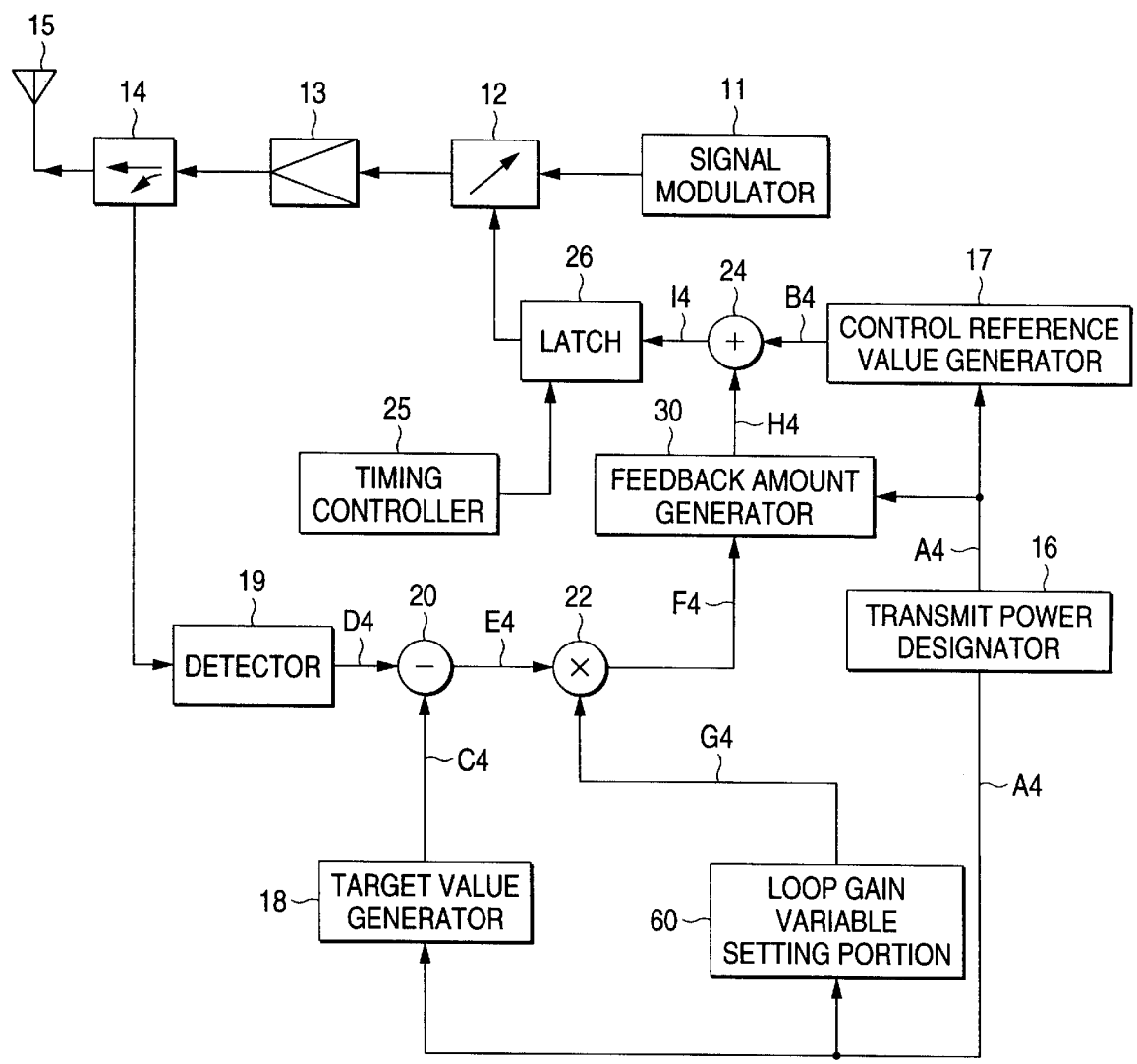
FIG. 12 is a view showing a configuration, mainly a transmit power controller, of a radio equipment according to a fourth embodiment of the present invention.

FIG. 12 is a view showing a configuration, mainly a transmit power controller, of a radio equipment according to a fourth embodiment of the present invention. In the fourth embodiment, a loop gain variable setting portion 60 which varies the loop gain based on the output of the transmit power designator 16 is provided. Configurations and operations of other parts are similar to those in the first embodiment. Therefore, only differences will be explained herein and same references are affix ed to identical constituent elements and their explanation will be omitted.

The loop gain variable setting portion 60 holds correction data, which is able to compensate linear distortion of the gain control in transmit power amplification by measuring previously gain control characteristics of the variable gain circuit 12, on a table, etc. , then varies the loop gain G4 based on transmit power designating information A4 designated by the transmit power designator 16, and then outputs such loop gain G4. For instance, if the linear distortion is caused in the gain control characteristic of the variable gain circuit 12 according to the intensity of the transmit power, the loop gain G4 is varied so as to correct such linear distortion. Regardless of the intensity of the transmit power, linearity of the transmit power output with respect to the designated transmit power can be maintained by compensating the linear distortion of gain control in the variable gain circuit 12. Thus, the transmit power can be adjusted with higher precision so as to converge toward the designated transmit power, so that the absolute precision of the transmit power can be improved.

In this manner, according to the fourth embodiment, the linearity of the transmit power control characteristic can be ensured with higher precision, and also the feedback control to compensate the transmit power precision can be achieved with higher precision.

FIFTH EMBODIMENT

Figure 13:
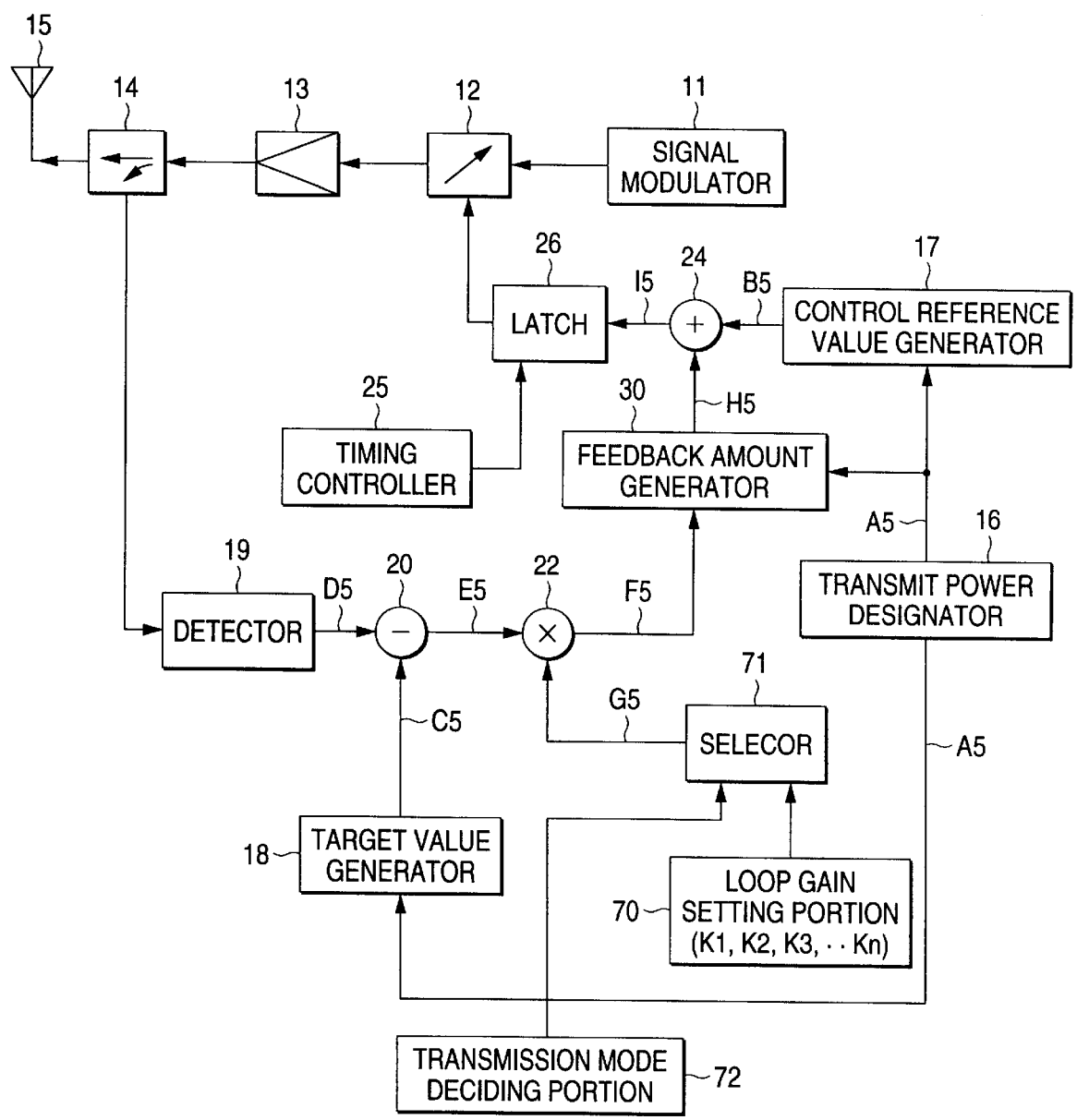
FIG. 13 is a view showing a configuration, mainly a transmit power controller, of a radio equipment according to a fifth embodiment of the present invention.

FIG. 13 is a view showing a configuration, mainly a transmit power controller, of a radio equipment according to a fifth embodiment of the present invention. In the fifth embodiment, a loop gain setting portion 70 for setting a plurality of loop gains and holding them, a transmission made deciding portion 72 for deciding a plurality of transmission modes in which their allowable ranges of power variable amount precision are set differently, and a selector 71 for selecting the loop gain which is output from the loop gain setting portion 70 to the loop gain multiplier 22 based on a decision result in the transmission mode deciding portion 72 are provided.

The loop gain setting portion 70 holds previously set loop gains K1, K2, K3, . . . , Kn (Kx is the number less than 1) corresponding to a plurality of transmission modes. Then, the loop gain being selected by switching the selector 71 in compliance with the transmission mode can be output as the set loop gain G5.

Figure 14:
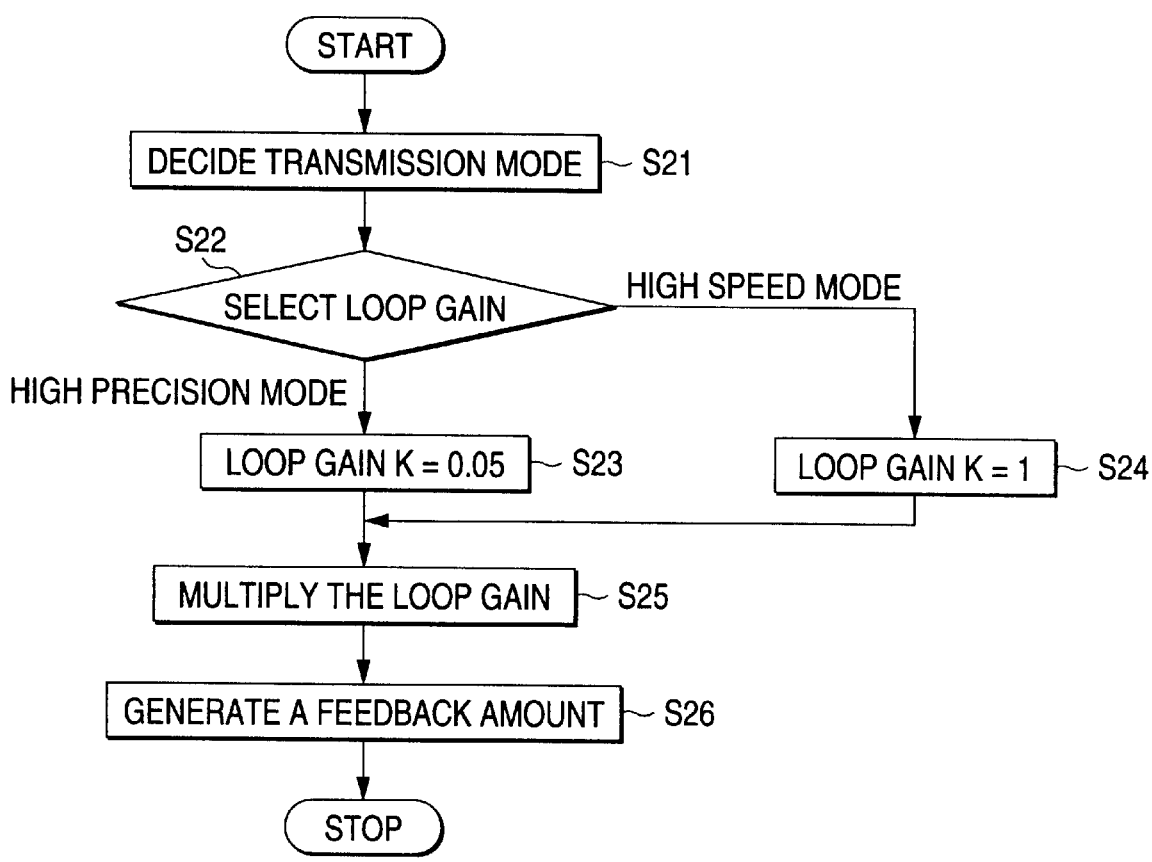
FIG. 14 a flowchart showing an operation of the loop gain setting portion mainly.
Figure 15:
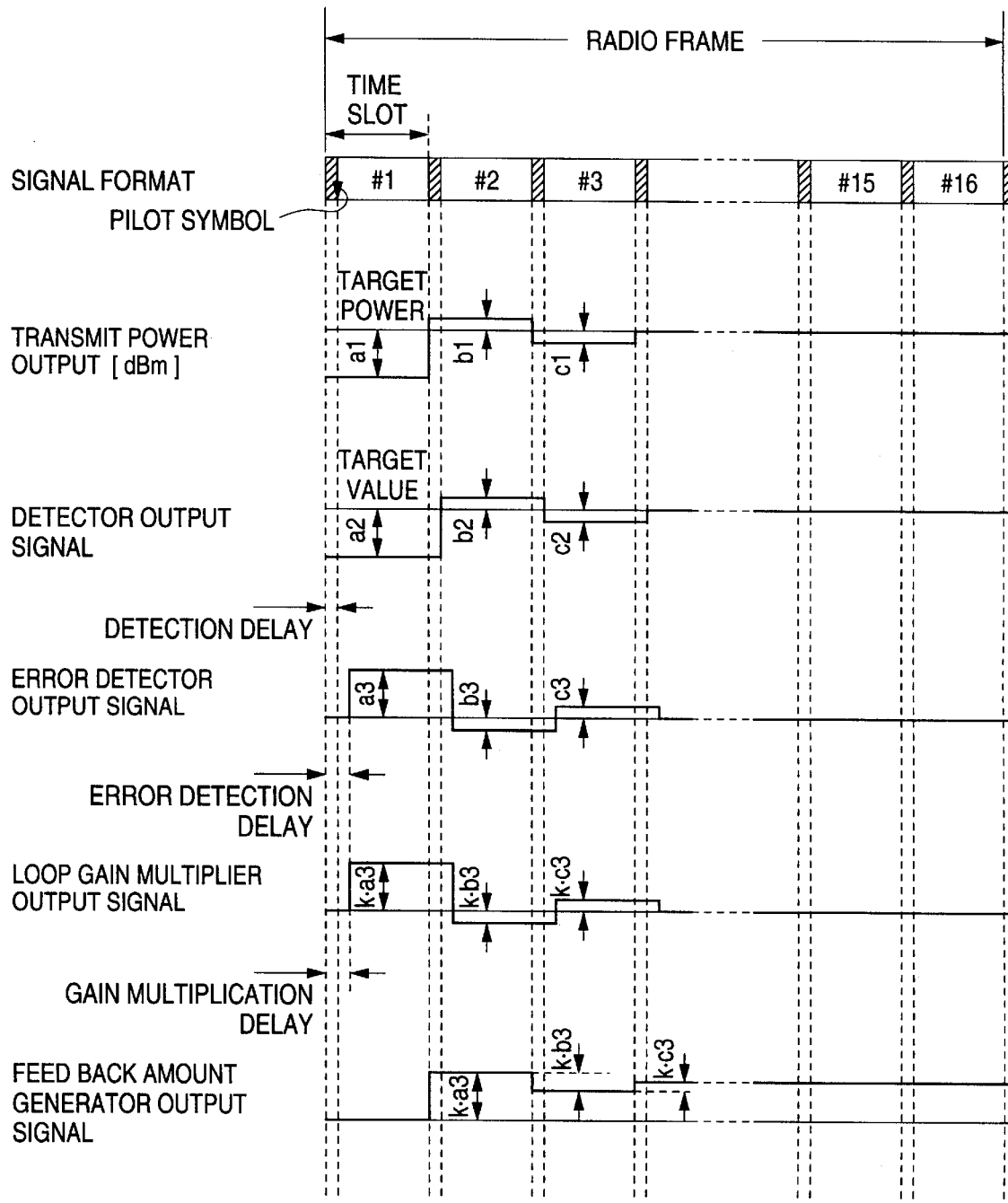
FIG. 15 a view showing a transmit power controlling operation executed in a high speed mode.

Next, an operation of the transmit power controller according to the fifth embodiment will be explained hereunder. FIG. 14 is a flowchart showing an operation of the loop gain setting portion mainly. FIG. 15 is a view showing a transmit power controlling operation in a high speed mode.

Two transmission modes, i.e., a high precision mode in which high power variable amount precision is requested and a high speed mode in which an allowable range of power variable amount precision is relatively large and also a speed request of control pulling-in mode to converge the transmit power to the designated transmit power to be transmitted (transmit power precision pulling-in mode) is selected preferentially will be explained herein.

In the transmission mode deciding portion 72, the transmission mode is decided according to the operating situation of the equipment, etc., and then a selected result is output to the selector 71 (step S21). In response to this decision result, the selector 71 selects the loop gain being suited for the transmission mode from a plurality of loop gains being set and held in the loop gain setting portion 70 (step S22).

In the case of high precision mode, the small loop gain K=0.05 which is a similar value to that in the first embodiment is selected and then output to the loop gain multiplier 22 as the set loop gain G5 (step S23). In contrast, in the case of high speed mode, the large loop gain K=1 is selected and then output to the loop gain multiplier 22 as the set loop gain G5 (step S24). Then, the set loop gain G5 being selected is multiplied by the transmit power error E5 in the loop gain multiplier 22 (step S25).

After this, the feedback correction value F5 being output from the loop gain multiplier 22 is added by the feedback amount generator 30 every control step to thus generate the feedback amount H5, and then output to the control variable adder 24 (step S26).

Although not illustrated particularly herein, an intermediate mode between the above two transmission modes may be thought about in accordance with the level of requested power variable amount precision.

FIG. 15 is a view showing output signals in respective parts in the high speed mode (loop gain K=1). For example, in the event that the state that the transmit power designating information A5 being designated by the transmit power designator 16 becomes constant is continued since a distance between the mobile station and the base station is not changed after the mobile station has been stopped, a rate of the transmit power precision pulling-in operation as the high speed mode is adopted preferentially. Thus, the feedback correction value F5 per control step is increased by increasing the loop gain, so that the transmit power control can be executed such that the transmit power output can be converged into the precision of the designated transmit power to be transmitted at a high speed. If the loop gain K=1, the value of the transmit power error E5 is output as the feedback correction value F5 after the loop gain multiplication as it is, and thus the large feedback amount H5 is output from the feedback amount generator 30 based on the transmit power error E5.

In contrast, in the event that the high precision mode in which the high power variable precision is requested to assure the transmit power control of high linearity is executed, the transmit power can be controlled not to exceed an allowable range of the power variable amount precision per control step by reducing the loop gain, like the first embodiment.

Like the above, according to the fifth embodiment, in response to a plurality of transmission modes in which degrees of the allowable range of the power variable amount precision being requested are differentiated, the feedback control can be effected to compensate the transmit power precision by setting appropriate loop gains in the transmission modes respectively, so that it is possible to secure both the predetermined power variable amount precision and the absolute precision of the transmit output.

As [KIK14]described above, according to the radio equipment, the transmit power controlling method in the radio equipment, and the recording medium, when the transmit power is adjusted by detecting the error based on difference between the detected value which is obtained by detecting the transmit signal of the radio equipment and the detected value of the transmit signal when it is transmitted by the designated transmit power to be transmitted, then calculating the correction value by multiplying this error by the predetermined gain, then generating the control amount based on the correction value, and then re-setting the gain in transmit power amplification based on the control amount at a predetermined timing, the predetermined gain can be set such that an amount of change in the transmit power to be adjusted based on the control amount can be suppressed in the allowable range requested for an amount of change in the transmit power to be adjusted based on the reference value of the transmit power control, which is generated based on the designated transmit power. Therefore, such advantages can be achieved that the transmit power precision compensating function for converging the transmit power into the predetermined range of the power control target value can be achieved in the radio equipment in which necessary absolute precision of the transmit power can be assured while keeping the power variable amount precision in transmit power adjustment and the transmit power control of wide dynamic range and high linearity also is requested.

In one control unit executed according to the predetermined control timing, the predetermined gain is set such that the amount of change in the transmit power based on the control amount can be reduced smaller than the requested allowable range of the amount of change in the transmit power based on the reference value, then the control amount is generated by adding the correction value per control unit, and then the transmit power is adjusted by using the control amount. Therefore, the transmit power can be adjusted so as to approach the designated transmit power to be transmitted gradually within the allowable range of the requested amount of change, and predetermined absolute precision of the transmit power can be assured.

Further, when the transmit power of the transmit signal is reduced less than predetermined power, the control amount can be generated by subtracting the predetermined value, which makes the amount of change in the transmit power per control unit smaller than the requested allowable range of the amount of change in the transmit power being adjusted based on the reference value, every control unit. Therefore, in the out-of-range of the detected value of the transmit signal, the control amount can be restored gradually into the initial state while adjusting the transmit power in the allowable range of the requested amount of change. Then, when the transmit power is in the detection range of the detected value of the transmit signal again, the radio equipment can be shifted smoothly to the transmit power adjusting operation which is executed based on the correction value.

Furthermore, the predetermined gain is set variably based on the detected error and then the control amount is made constant based on the correction value after the error has been multiplied by the predetermined gain. Therefore, the transmit power can be adjusted within the allowable range of the requested amount of change based on a constant correction value irrespective of the current error, and thus the transmit power can be converged to the designated transmit power to be transmitted at a higher speed, so that the absolute precision of the transmit power can be improved.

Moreover, the predetermined gain can be set variably based on the designated transmit power being designated by the transmit power designating means such that linear distortion of the gain control executed by the previously set power adjusting means (power adjusting step) can be compensated. Therefore, the linearity of the output transmit power with respect to the designated transmit power can be maintained regardless of the intensity of the transmit power and thus the linearity of the transmit power control characteristic can be ensured with higher precision.

Also, the predetermined gain can be set in respective transmit modes which correspond to the levels of the requested allowable ranges to the amount of change in the transmit power being adjusted based on the reference value. Therefore, the transmit power control can be carried out more appropriately in response to a plurality of transmission modes in which allowable ranges of the amount of change in the requested transmit power are set differently respectively.

When the feedback control is carried out by multiplying the error between the power control target value equivalent to the transmit power to be transmitted and the actual transmit power detected value by the loop gain in the feedback loop to calculate the correction value and then feeding back the control amount based on the correction value to the power adjusting means for adjusting the transmit power, the correction value can be set smaller than the allowable range of the power adjusting amount being executed every control unit at the predetermined timing by setting the loop gain of the feedback loop to less than 1. Therefore, the transmit power can always be adjusted within the allowable range of the requested amount of change, and thus the predetermined absolute precision of the transmit power can be assured with keeping the linearity of the transmit power control characteristic.

What is claimed is:

1. A radio equipment comprising:
   transmit power designating means for designating a transmit power of a transmit signal transmitted from the radio equipment;
   control reference value generating means for generating a reference value of transmit power control based on the transmit power being designated;
   timing controlling means for specifying a control timing of the transmit power;
   error detecting means for detecting an error based on difference between a detected value of the transmit signal from the radio equipment and a detected value of the transmit signal when it is transmitted by the transmit power being designated;
   gain multiplying means for multiplying a detected error by a predetermined gain to calculate a correction value;
   control amount generating means for generating a control amount based on the correction value; and
   power adjusting means for adjusting the transmit power by re-setting again in transmit power amplification at the control timing, based on a reference value of the transmit power control and the control amount;
   wherein the predetermined gain is set such that an amount of change in the transmit power which is adjusted based on the control amount can be suppressed in an allowable range which is requested for an amount of change in the transmit power being adjusted based on the reference value.

2. A radio equipment according to claim 1, wherein the control amount generating means generates a control amount by adding the correction value, which is effected according to the control timing, every control unit, and
   the predetermined gain is set such that an amount of change in the transmit power which is adjusted based on the control amount per one control unit can be made smaller than an allowable range requested for an amount of change in the transmit power which is adjusted based on the reference value.

3. A radio equipment according to claim 2, further comprising:
   a gain variable setting means for setting the predetermined gain variably based on an error detected by the error detecting means such that the correction value is fixed constant.

4. A radio equipment according to claim 2, further comprising:

a gain variable setting means for setting the predetermined gain variably based on a designated transmit power designated by the transmit power designating means such that linear distortion of gain control by the power adjusting means can be compensated.

5. A radio equipment according to claim 2, further comprising:
a gain setting means for setting the predetermined gain every transmission mode in answer to a level of an allowable range requested for an amount of change in the transmit power being adjusted based on the reference value;
a transmission mode deciding means for deciding the transmission mode; and
a selecting means for selecting a predetermined gain which corresponds to a decided transmission mode from the gain setting means.

6. A radio equipment according to claim 1, wherein the control amount generating means generates a control amount by subtracting, every control unit, a predetermined value which is set such that an amount of change in the transmit power per one control unit can be made smaller than an allowable range requested for an amount of change in the transmit power which is adjusted based on the reference value when the transmit power of the transmit signal is less than a predetermined power.

7. A radio equipment according to claim 1, further comprising:
a gain variable setting means for setting the predetermined gain variably based on an error detected by the error detecting means such that the correction value is fixed constant.

8. A radio equipment according to claim 1, further comprising:
a gain variable setting means for setting the predetermined gain variably based on a designated transmit power designated by the transmit power designating means such that linear distortion of gain control by the power adjusting means can be compensated.

9. A radio equipment according to claim 1, further comprising:
a gain setting means for setting the predetermined gain every transmission mode in answer to a level of an allowable range requested for an amount of change in the transmit power being adjusted based on the reference value;
a transmission mode deciding means for deciding the transmission mode; and
a selecting means for selecting a predetermined gain which corresponds to a decided transmission mode from the gain setting means.

10. A transmit power controlling method in a radio equipment, comprising the steps of:
transmit power designating step of designating a transmit power of a transmit signal transmitted from the radio equipment;
control reference value generating step of generating a reference value of transmit power control based on the transmit power being designated;
error detecting step of detecting an error based on difference between a detected value of the transmit signal from the radio equipment and a detected value of the transmit signal when it is transmitted by the transmit power being designated;
gain multiplying step of multiplying a detected error by a predetermined gain to calculate a correction value;

control amount generating step of generating a control amount based on the correction value; and
power adjusting step of adjusting the transmit power by re-setting a gain in transmit power amplification at a predetermined control timing, based on a reference value of the transmit power control and the control amount;
wherein the predetermined gain is set such that an amount of change in the transmit power which is adjusted based on the control amount can be suppressed in an allowable range which is requested for an amount of change in the transmit power being adjusted based on the reference value.

11. A transmit power controlling method in a radio equipment according to claim 10, wherein the control amount generating step generates a control amount by adding the correction value, which is effected according to the control timing, every control unit, and
the predetermined gain is set such that an amount of change in the transmit power which is adjusted based on the control amount per one control unit can be made smaller than an allowable range requested for an amount of change in the transmit power which is adjusted based on the reference value.

12. A transmit power controlling method in a radio equipment according to claim 11, further comprising gain variable setting step of setting the predetermined gain variably based on an error detected by the error detecting means such that the correction value is fixed constant.

13. A transmit power controlling method in a radio equipment according to claim 11, further comprising gain variable setting step of setting the predetermined gain variably based on a designated transmit power designated by the transmit power designating means such that linear distortion of gain control by the power adjusting means can be compensated.

14. A transmit power controlling method in a radio equipment according to claim 11, further comprising gain setting step of setting the predetermined gain every transmission mode in answer to a level of an allowable range requested for an amount of change in the transmit power being adjusted based on the reference value;
transmission mode deciding step of deciding the transmission mode; and
selecting step of selecting a predetermined gain which corresponds to a decided transmission mode from the gain setting means.

15. A transmit power controlling method in a radio equipment according to claim 10, wherein the control amount generating step generates a control amount by subtracting, every control unit, a predetermined value which is set such that an amount of change in the transmit power per one control unit can be made smaller than an allowable range requested for an amount of change in the transmit power which is adjusted based on the reference value when the transmit power of the transmit signal is less than a predetermined power.

16. A transmit power controlling method in a radio equipment according to claim 10, further comprising gain variable setting step of setting the predetermined gain variably based on an error detected by the error detecting means such that the correction value is fixed constant.

17. A transmit power controlling method in a radio equipment according to claim 10, further comprising gain variable setting step of setting the predetermined gain variably based on a designated transmit power designated by the transmit power designating means such that linear distortion of gain control by the power adjusting means can be compensated.

18. A transmit power controlling method in a radio equipment according to claim 10, further comprising gain setting step of setting the predetermined gain every transmission mode in answer to a level of an allowable range requested for an amount of change in the transmit power being adjusted based on the reference value;

transmission mode deciding step of deciding the transmission mode; and selecting step of selecting a predetermined gain which corresponds to a decided transmission mode from the gain setting means.

19. A computer-readable recording medium for recording a program which causes a computer to execute a transmit power controlling method in a radio equipment set forth in any one of claims 10 to 18.

20. A transmit power controlling method for controlling a transmit power of a transmit signal being output from a radio equipment to execute a mobile communication, comprising:

feedback control step of executing feedback control of the transmit power via a feedback loop which feeds back a control amount being defined based on an error between a power control target value, which corresponds to the transmit power to be transmitted from the radio equipment, and an actual transmit power detected value to a power adjusting means which adjusts the transmit power;

wherein, in the feedback control step, a value which is smaller than an allowable range of power adjusting amount per one control unit is calculated as a correction value at a predetermined timing by setting a loop gain of the feedback loop to less than 1 and then multiplying the error by the loop gain, and the control amount is generated based on the correction value and then fed back to the power adjusting means.

21. A transmit power controlling method for controlling a transmit power of a transmit signal being output from a radio equipment to execute a mobile communication, comprising:

feedback control step of executing feedback control of the transmit power via a feedback loop which feeds back a control amount being defined based on an error between a power control target value, which corresponds to the transmit power to be transmitted from the radio equipment, and an actual transmit power detected value to a power adjusting means which adjusts the transmit power;

wherein the feedback control step includes, correction value calculating step of calculating a value which is smaller than an allowable range of power adjusting amount per one control unit as a correction value at a predetermined timing by setting a loop gain of the feedback loop to less than 1 and then multiplying the error by the loop gain, control amount generating step of generating a control amount by adding the correction value per control unit every control unit, and power adjusting step of adjusting the transmit power by feeding back the control amount to the power adjusting means.

* * * * *